(12) United States Patent
Kulas et al.

(10) Patent No.: US 11,977,104 B2
(45) Date of Patent: May 7, 2024

(54) MOUNTING DEVICE, SWITCHGEAR CABINET AND READ-OUT DEVICE

(71) Applicant: WAGO Verwaltungsgesellschaft mbH, Minden (DE)

(72) Inventors: Sascha Kulas, Hannover (DE); Ulrich Hempen, Minden (DE)

(73) Assignee: WAGO Verwaltungsgesellschaft mbH, Minden (DE)

( * ) Notice: Subject to any disclaimer, the term of this patent is extended or adjusted under 35 U.S.C. 154(b) by 395 days.

(21) Appl. No.: 17/385,307

(22) Filed: Jul. 26, 2021

(65) Prior Publication Data

US 2021/0349133 A1    Nov. 11, 2021

Related U.S. Application Data

(63) Continuation of application No. PCT/EP2020/051026, filed on Jan. 16, 2020.

(30) Foreign Application Priority Data

Jan. 25, 2019  (DE) .................... 20 2019 100 449.5

(51) Int. Cl.
*G01R 21/06* (2006.01)
*G01R 15/14* (2006.01)

(52) U.S. Cl.
CPC ............. *G01R 21/06* (2013.01); *G01R 15/14* (2013.01)

(58) Field of Classification Search
CPC ......... G01R 21/06; G01R 15/14; G01D 11/30
USPC .................................. 324/140 R, 76.11, 500
See application file for complete search history.

(56) References Cited

U.S. PATENT DOCUMENTS

| | | | | |
|---|---|---|---|---|
| 3,783,239 A | * | 1/1974 | Hill | ........................ F24C 15/102 |
| | | | | 392/422 |
| 4,829,818 A | * | 5/1989 | Bohrer | .................. G01F 1/6845 |
| | | | | 73/204.22 |
| 7,656,636 B2 | | 2/2010 | Houbre | |
| 7,855,873 B2 | | 12/2010 | Darr et al. | |
| 8,754,718 B2 | * | 6/2014 | Horie | ........................ H03B 1/02 |
| | | | | 331/158 |
| 9,454,140 B2 | | 9/2016 | Godau et al. | |

(Continued)

FOREIGN PATENT DOCUMENTS

| | | |
|---|---|---|
| CN | 101400234 A | 4/2009 |
| DE | 102011110182 A1 | 2/2013 |

(Continued)

OTHER PUBLICATIONS

International Preliminary Report on Patentability dated Aug. 5, 2021 in corresponding application PCT/EP2020/051026.

(Continued)

*Primary Examiner* — Giovanni Astacio-Oquendo
(74) *Attorney, Agent, or Firm* — Muncy, Geissler, Olds & Lowe, P.C.

(57) ABSTRACT

A mounting device for mounting one or more conductor terminals on an object, wherein the mounting device has one or more mounting points, with at least one securing element being arranged at each mounting point for mechanically securing one or more conductor terminals to said mounting point, the mounting device having at least one sensor device which has at least one sensor for acquiring a physical value of at least one conductor terminal secured to a mounting point.

24 Claims, 3 Drawing Sheets

(56) References Cited

U.S. PATENT DOCUMENTS

| | | | |
|---|---|---|---|
| 9,474,178 B2 | 10/2016 | Binner | |
| 10,281,503 B2* | 5/2019 | Steuer | G01R 15/16 |
| 10,901,008 B2* | 1/2021 | Kast | H01F 27/23 |
| 2007/0252670 A1 | 11/2007 | Darr | |
| 2018/0331571 A1 | 11/2018 | Smit | |
| 2021/0098906 A1 | 4/2021 | Kulas et al. | |
| 2022/0170962 A1* | 6/2022 | Sutton | H02J 50/001 |

FOREIGN PATENT DOCUMENTS

| | | |
|---|---|---|
| DE | 202014009161 U1 | 1/2016 |
| DE | 102016122157 B3 | 5/2018 |
| DE | 102018005776 A1 | 2/2019 |
| EP | 1280178 A1 | 1/2003 |
| EP | 1750343 A1 | 2/2010 |
| EP | 3187886 A1 | 7/2017 |
| EP | 3706264 A1 | 9/2020 |
| FR | 2967832 A1 | 5/2012 |
| WO | WO2009064769 A1 | 5/2009 |
| WO | WO2014001329 A1 | 1/2014 |
| WO | WO2019238672 A1 | 12/2019 |

OTHER PUBLICATIONS

International Search Report dated Apr. 20, 2020 in corresponding application PCT/EP2020/051026.

* cited by examiner

MOUNTING DEVICE, SWITCHGEAR CABINET AND READ-OUT DEVICE

This nonprovisional application is a continuation of International Application No. PCT/EP2020/051026, which was filed on Jan. 16, 2020, and which claims priority to German Patent Application No. 20 2019 100 449.5, which was filed in Germany on Jan. 25, 2019, and which are both herein incorporated by reference.

BACKGROUND OF THE INVENTION

Field of the Invention

The present invention relates to a mounting device for mounting one or more conductor terminals on an object, wherein the mounting device has one or more mounting points, with at least one securing element being arranged at each mounting point for mechanically securing one or more conductor terminals to said mounting point. The invention also relates to a switchgear cabinet with at least one such mounting device and a readout device for reading acquired measured values.

Description of the Background Art

Mounting devices of this kind are known, for example, from mounting adapters of the 221 series from the applicant. Securing the conductor terminals to a mounting rail, for example, can be realized by means of such a mounting adapter. A further known mounting device is, for example, a stove connection box, which has a housing with a plurality of mounting points, on each of which one or more conductor terminals can be mounted.

SUMMARY OF THE INVENTION

It is therefore an object of the present invention to provide an option that is easy for the user to use for acquiring physical values of the conductor terminals secured to the mounting device, such as, e.g., current, voltage, or temperature.

The object is achieved with a mounting device in that the mounting device has at least one sensor device which has at least one sensor for acquiring a physical value of at least one conductor terminal secured to a mounting point. This makes it possible, depending on the design of the at least one sensor, to acquire practically any physical values of the conductor terminals. The sensor device can also have multiple sensors, e.g., sensors for acquiring different physical values such as current and voltage.

In this case, one mounting point can be configured to receive and secure exactly one conductor terminal. A variable assignment can also be possible, for example, in such a way that multiple conductor terminals can be arranged at one mounting point, wherein conductor terminals can also protrude into an adjacent mounting point and can be additionally secured there. A conductor terminal can also occupy a plurality of mounting points or at least protrude into one or two adjacent mounting points and also be secured there. In this context, a conductor terminal is understood to be a conductor terminal for connecting a single electrical conductor or a multi-conductor terminal to which multiple electrical conductors can be secured and which has its own conductor insertion opening for each electrical conductor to be mounted.

The sensor device can be structurally at least partially or completely integrated in the mounting device, in particular in a housing of the mounting device. In this way, the sensor device can be at least largely protected from damage and, moreover, housed inconspicuously. The housing of the mounting device does not need to be a closed housing; it can also have openings, for example, on one side or on multiple sides.

At least one sensor can be arranged at a position in the mounting device, in the immediate vicinity of which a busbar of a conductor terminal secured to a mounting point is arranged. This allows reliable sensing of the physical value by the at least one sensor.

One, multiple, or all mounting points of the mounting device can be set up for securing a conductor terminal using spring-loaded clamping technology. The design of the conductor terminal using spring-loaded clamping technology allows simple and reliable securing of the electrical conductor to this conductor terminal. For this purpose, the conductor terminal can have a contact insert which has at least one clamping spring for clamping the electrical conductor, wherein the electrical conductor can be clamped, for example, against a busbar by the clamping spring.

The mounting device without the sensor device can be designed as a passive component without its own electrical functionality. This allows the mounting device to be provided in a simple and inexpensive manner. The mounting device can be designed, for example, as a simple plastic component, e.g., as an injection molded component.

At least one securing element of a mounting point can be designed as a latching securing element by means of which a conductor terminal can be secured to the mounting point by latching. This allows a simple and convenient securing of a conductor terminal to a mounting point. In addition, the conductor terminal can also be released again from the mounting device.

The sensor device can have a wireless transmission unit which is set up for the wireless transmission of measured values from the at least one sensor of the sensor device to a readout device that is separate from the sensor device. This has the advantage that no complex cabling has to be attached to the mounting device or in the switchgear cabinet for providing and forwarding the measured values of the sensor device. Instead, the measured values can be transmitted wirelessly, e.g., by radio transmission, inductive or capacitive coupling, or optical data transmission. In particular, this can be a UHF wireless transmission, e.g., with a transmission path within the switchgear cabinet. The sensor device can have, for example, its own RFID transponder and/or a WLAN transmitter so that the acquired measured values can be transmitted wirelessly, e.g., as preprocessed measured values and/or as raw data, to an evaluation device via WLAN transmission. The wireless transmission unit can be designed, e.g., as a Bluetooth module. The wireless transmission unit can also be designed as a comparable different radio standard or another wireless transmission standard, e.g., as an RFID transponder, as a WLAN transmission unit, as an NFC transmission unit, or as a ZigBee transmission unit.

The sensor device can have a first wireless transmission unit for the transmission of measured values of a current, measured by the sensor device, and at least one second wireless transmission unit for the wireless transmission of measured values of a voltage or potential measured by the sensor device. In this way, the current and voltage of an electrical line can be acquired. This makes it possible, for example, to determine the electrical energy in an external readout device or an evaluation device and accordingly to carry out a power measurement in the mounting device. The sensor device can be designed with the first and second wireless transmission units in the form of a structural unit or in the form of separate structural units, e.g., in that one structural unit of the sensor device has the first wireless transmission unit and the other structural unit has the second wireless transmission unit.

The sensor device can be supplied with the electrical energy required for operating the sensor device, e.g., via an electrical line. It is also advantageous to equip the sensor device with its own electrical energy source, e.g., a rechargeable battery or battery. In this way, an autonomous functionality of the mounting device with the sensor device is ensured. In this case, no electrical line needs to be laid to the sensor device for the energy supply.

The sensor device can also derive its energy supply directly from the physical value to be acquired by the sensor, e.g., a current and/or a voltage. In the case of a non-contact current measurement, the electrical energy can be derived, for example, via the magnetic field generated by the current to be measured.

The sensor device can be set up for the wireless supplying of electrical energy required for operating the sensor device. This has the advantage that the sensor device can be provided without its own energy source. In addition, no separate cabling is required to supply the electrical energy via electrical lines to the sensor device. This also simplifies the installation of the sensor device on the mounting device. In addition, maintenance is simplified because a separate energy source of the sensor device does not need to be replaced or charged. The transmission of energy can occur, e.g., by radio transmission, inductive or capacitive coupling, or optical transmission.

If an optical energy transmission is carried out, the sensor module can be designed, for example, with one or more solar cells and can obtain therefrom the electrical energy required for operating the sensor module. In the case of inductive or capacitive transmission, the sensor module can be supplied with electrical energy, for example, inductively or capacitively, from an adjacent conductor terminal.

The sensor device can have an energy harvesting device which is set up to wirelessly receive electrical energy from the surroundings of the sensor device and to provide the electrical energy for the electrical supplying of components of the sensor device. In this way, practically any energy sources in the surroundings can be tapped and used to supply electrical energy to the sensor device.

In addition to the measured values of the at least one sensor, the sensor device can also provide additional data, e.g., an identification code that can be used to identify the sensor device. In this way, it is possible to differentiate between the measured values of different sensor devices with little effort, in particular in the case of wireless transmission.

The sensor device can be designed as a sensor module, i.e., as a structural unit which has all the components necessary for the operation of the sensor device. The sensor module can be manufactured, e.g., as MID (molded interconnect devices). In this case, all components including the electronics of the sensor module can be injection molded in a plastic material. The sensor device can also have separate components such as the at least one sensor, an antenna, and/or an electronic assembly. These separate components can be arranged, e.g., distributed in the mounting device and be electrically connected to one another. The sensor device can in particular have a dipole antenna.

The at least one sensor of the sensor device can, for example, be a current sensor for acquiring the electrical current, e.g., the current through a busbar of the conductor terminal, a voltage sensor, a temperature sensor, a humidity sensor, an acceleration sensor, a vibration sensor, or some other sensor. The sensor device can also have a plurality of similar or different sensors. There can be further sensors.

The at least one sensor can be a current sensor, such as, e.g., a shunt. The at least one sensor can also be a contactless current sensor. For example, the current sensor can be designed by means of an AMR sensor, other magnetic field-dependent resistors (MDR—magnetic dependent resistor), or as a Hall sensor. This allows contactless acquisition of the electrical current via the magnetic field generated by the electrical current. In addition, the subsequent attachment of the sensor device to the mounting device is simplified. A further advantage of such a current sensor is that high currents, e.g., above 100 amperes, as well as low currents of less than 1 ampere can be measured equally well.

The at least one sensor can be a voltage sensor or a further sensor of the sensor device is a voltage sensor. The voltage sensor can be a contactless voltage sensor, e.g., a capacitive sensor. This allows contactless acquisition of the electrical voltage by capacitive coupling into the voltage sensor. The subsequent attachment of the sensor device to the mounting device is also simplified hereby.

The sensor device can be set up for acquiring at least two or at least three voltage potentials from conductor terminals secured to mounting points of the mounting device. If there are connection options for acquiring two voltage potentials, for example, the voltage potential of the neutral conductor can be acquired thereby as a reference voltage value. In addition, with the other connection option, a live line such as, e.g., a phase of a three-phase network can be acquired with regard to the voltage potential. In this way, the voltage can be measured on a phase, for example. If further connection options are available for the acquisition of further voltage potentials, the voltages of two or all three phases of a three-phase network or another electrical supply can also be acquired.

The voltage can be determined from the acquired voltage potentials in the sensor device, an external readout device, or a separate evaluation device. For example, the detected voltage potential measured values can be transmitted wirelessly to the readout device and the corresponding voltage value and, together with the acquired current value, the power value can thus be determined in the readout device.

Accordingly, a three-phase power measurement on a mounting device can be realized in a simple manner and with little retrofitting effort.

The sensor device can be set up for acquiring the phase position of a current acquired by the sensor device with respect to a voltage potential acquired by the sensor device. In this way, phase information of the electrical data can be obtained and the monitoring of the mounting device or the switchgear cabinet can be improved even further hereby. Depending on the circuit design of the sensor device, further information can also be obtained, e.g., information about the voltage such as frequency, phase, magnitude, RMS value, and/or harmonics.

The mounting device can have a mounting rail securing element, by means of which the mounting device can be secured at least partially form-fittingly to a mounting rail of the electrical installation system. The mounting device can be snapped, for example, onto the mounting rail via the mounting rail securing element.

One or more conductor terminals can be secured to the respective mounting points on the mounting device.

The aforementioned object is also achieved by a switchgear cabinet with at least one mounting device of the type described above. The previously described advantages are also realized in this way.

A readout device for reading acquired measured values of one or more sensor devices of the mounting device can be arranged in the switchgear cabinet. This has the advantage that only a short transmission path for the acquired measured values from the sensor device to the readout device has to be overcome. This is particularly advantageous for wireless transmissions, both with regard to the measured values and with regard to the supplying of electrical energy. For example, the readout device can have a transponder reader. In this way, the readout device enables both reading of the measured values by wireless transmission and also the wireless supplying of the sensor device with electrical energy.

The aforementioned object is also achieved by a readout device for reading acquired measured values of one or more sensor devices of the mounting device. The previously described advantages are also realized in this way.

The readout device can also already contain an evaluation device for evaluating the acquired measured values. Alternatively, the readout device can be connected to a remotely located evaluation device, e.g., via electrical lines or via wireless transmission. For example, the readout device can be connected to a WLAN device or have such a device over which the acquired measured values are transmitted wirelessly to the evaluation device.

The readout device can be arranged on the inside of a door of the switchgear cabinet. This has the advantage that the readout device is arranged particularly close to one or more sensor devices in the switchgear cabinet, at least when the door of the switchgear cabinet is closed, so that only a particularly short distance has to be overcome for wireless transmission.

The readout device can have, for example, a Bluetooth reader and a gateway. The readout device reads the measured values of various sensor devices of the mounting device wirelessly. The read measured values are converted into an appropriate format and forwarded via various interfaces, e.g., GSM, WLAN. The readout device can also serve as a measuring transformer and for standardizing the measured values and signals. The readout device can have, e.g., a cloud connection via WLAN. The readout device thus functions as a multi-communicator (MUC).

The readout device can transmit measured values and other data to an evaluation device or receive data from an evaluation device via the gateway. The gateway can have, e.g., a wireless interface for data communication, e.g., GSM, WLAN.

In order to increase the measuring accuracy of the sensor device, for example, a software calibration of the acquired measured values can be performed, e.g., by already performing the calibration in the sensor device using a calibration curve stored in the sensor device, or by performing the calibration in the readout device using a calibration curve stored in the readout device. The readout device can then select the calibration curve that matches a sensor device from a large number of calibration curves on the basis of the unique identification code of the sensor device. In-situ calibration using an external ammeter is also possible.

The readout device can be set up to determine a power measured value from current and voltage measured values that the readout device has read from one or more sensor devices of the mounting device. This allows an even more precise monitoring of the mounting device and thus of the switchgear cabinet.

The invention thus allows a three-phase power measurement in the switchgear cabinet in a simple manner. UHF-RFID technology and magnetic field sensors can provide the basis for implementing the invention. The hardware for three-phase power measurement can be integrated very easily into a mounting device during the manufacturing process due to the realizable size, or it can be attached relatively easily to the mounting device afterwards.

Within the context of the present invention, the indefinite article "a" ("an") is not to be understood as a numeral. If therefore, e.g., a component is being discussed, this should be interpreted in the sense of "at least one component." Insofar as angles are given in degrees, they refer to a circular measure of 360 degrees (360°). If a computer is mentioned, it can be set up to execute a computer program, e.g., in the sense of software. The computer can be designed as a commercially available computer, e.g., as a PC, laptop, notebook, tablet, or smartphone, or as a microprocessor, microcontroller, or FPGA, or as a combination of such elements. If regulation is mentioned, regulation differs from control in that regulation has a feedback of measured or internal values, with which the generated output values of the regulation are in turn influenced in the sense of a closed control loop. In the case of control, a variable is controlled purely without such a feedback.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
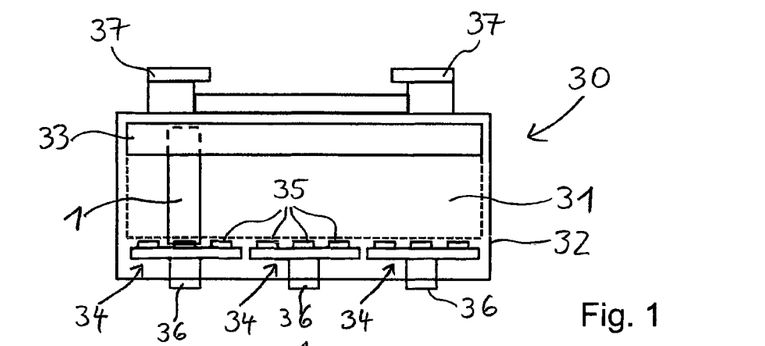
FIG. 1 shows a mounting device in a plan view.

Mounting device 30 shown in FIG. 1 has a frame-like housing 32 which has a mounting region for conductor terminals 1, which forms one or more mounting points 31, on an upper side which can be seen in the plan view according to FIG. 1. For the mechanical securing of conductor terminals 1 at a mounting point 31, a rear securing element 33 is provided which overlaps a rear region of a conductor terminal 1. To secure conductor terminal 1 in the front region, where conductor terminal 1 has a conductor insertion opening for the insertion of an electrical conductor, mounting device 30 has a plurality of front securing elements 34. Front securing elements 34 each have one or more protruding latching lugs 35 in which a conductor terminal 1 can be latched with a short front section of its conductor insertion opening. Further, front securing elements 34 each have at least one manual actuating element 36, via which the securing between a latching element 35 and a conductor terminal 1 can be removed by an appropriate manual actuation.

In a rear region facing away from front securing elements 34, mounting device 30 has one or more mounting rail securing elements 37. With such mounting rail securing elements 37, mounting device can be secured at least partially form-fittingly to a mounting rail of the electrical installation system, e.g., such that the mounting device is snapped onto the mounting rail in a manner comparable to that known in the case of a terminal block.

Figure 2:
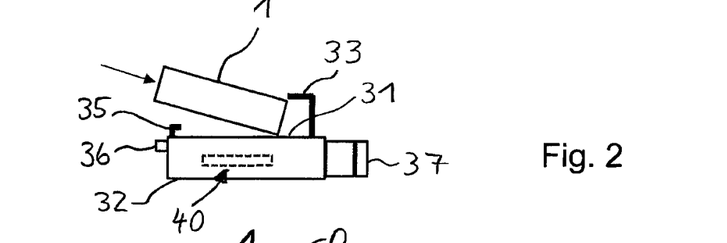
FIGS. 2 and 3 show the mounting device according to FIG. 1 in a side view.
Figure 3:
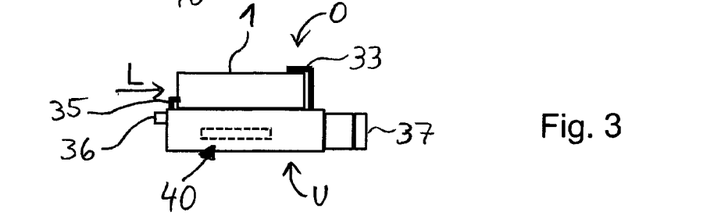

FIGS. 2 and 3 show, in a side view, the securing of a conductor terminal 1 at a mounting point 31 of mounting device 30. Conductor terminal 1 is first pushed with its rear side, i.e., the side facing away from the conductor insertion opening, forward below the hook-like rear securing element 33 and then snapped in by a downward movement with its front side under a latching element 35. Latching element 35 snaps somewhat into the front region of the conductor insertion opening and thus secures the conductor terminal by holding the insulating material of the insulating material housing of conductor terminal 1, said material surrounding the conductor insertion opening. By manually actuating the actuating element 36 from above, i.e., from the top side O, latching element 35 can be deflected somewhat and thus moved again out of the conductor insertion opening of conductor terminal 1. In this way, conductor terminal 1 can be removed again from mounting device 30.

Figure 4:
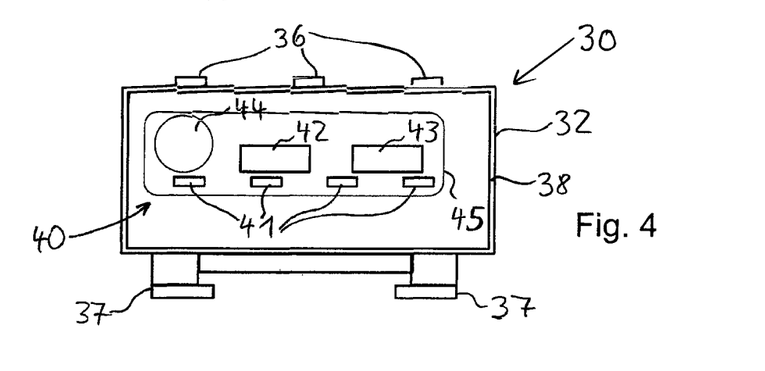
FIG. 4 shows the mounting device according to FIG. 1 in a view from below.

FIGS. 2 and 3 show the presence of a sensor device 40 within the region surrounded by housing 32 by means of dashes (because the device is not visible). Housing 32 can be formed closed on a bottom side U or partially or completely open. FIG. 4 shows mounting device 30 from the bottom side U, it being assumed that a bottom side of the housing is open.

In this illustration, sensor device 40 can be seen with further details. Sensor device 40 has one or more sensors 41, e.g., in the form of non-contact acting sensors, e.g., Hall sensors. Sensor device 40 has one or more batteries 44 for the electrical energy supply, e.g., in the form of button cells. Sensor device 40 further has a computing unit 42 and a wireless transmission device 43. Computing unit 42 can execute an evaluation program with which the values of sensors 41 are acquired, possibly already preprocessed and/or evaluated, and either the directly acquired data of sensors 41 and/or such evaluated data are transmitted via wireless transmission unit 43 to a remote evaluation unit. The described elements of sensor device 40, i.e., sensors 41, energy source 44, computing unit 42, and/or wireless transmission unit 43 can be arranged on a circuit board 45. In this way, one or more physical values of a conductor terminal 1 secured to a mounting point 31 can be acquired by means of a sensor 41 or a plurality of sensors 41, e.g., the current flowing through a conductor rail of conductor terminal 1 and the voltage potential present there.

Figure 5:
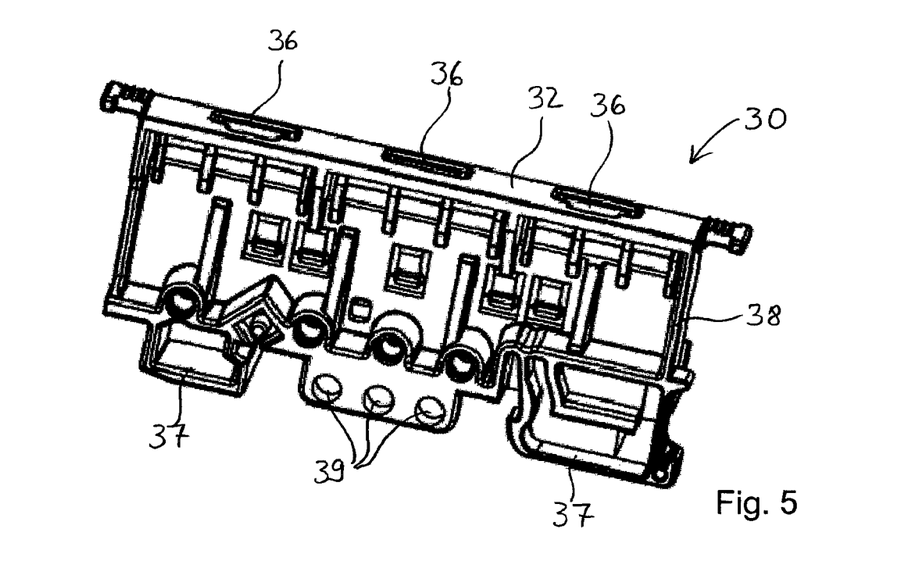
FIG. 5 shows a mounting device in a perspective view.
Figure 6:
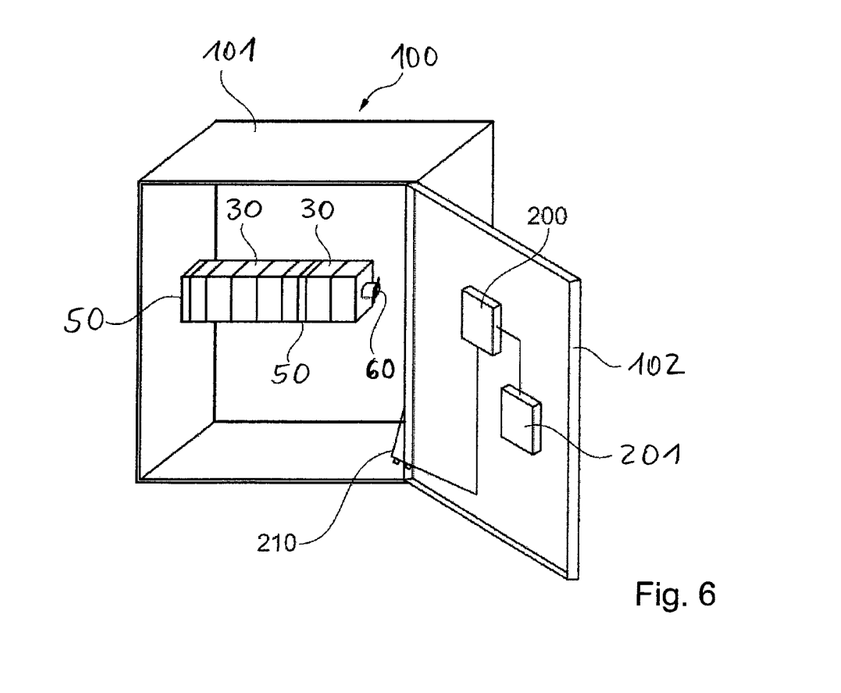
FIG. 6 shows a switchgear cabinet in a perspective view.

FIG. 5 shows a mounting device 30 which is of comparable design to that of mounting device 30 already explained, but is provided with further details. Mounting device 30 is shown from the bottom side U, wherein for better illustration, sensor device 40 to be arranged there according to the invention is not shown.

It can be seen that at least one of the mounting rail securing elements 37 can be formed as a relatively flexible, resilient component, so that sufficient resilience is ensured for the snapping of mounting device 30 onto the mounting rail and for any subsequent removal of mounting device 30 from the mounting rail.

It can also be seen that mounting device 30 can also have alternative securing elements, i.e., in addition or as an alternative to the mounting rail securing elements 37. For example, mounting device 30 can have a plurality of through holes at different points, via which mounting device 30 can be screwed, riveted, or nailed to an object.

It can also be seen in FIG. 4 that the installation space for sensor device 40, which can be seen from the bottom side U, can be surrounded by a frame-like wall 38 of housing 32, said wall surrounding the installation space.

Said wall 38 does not need to run regularly in a straight line in all embodiments as shown in FIG. 4, but can also, for example, assume the much more curvaceous course according to FIG. 5 or other designs.

FIG. 5 shows a switchgear cabinet 100 in a perspective view. Switchgear cabinet 100 has a housing body 101 and a door 102. Door 102 is pivotably connected to housing body 101. FIG. 5 shows switchgear cabinet 100 with door 102 open. A mounting rail 60 is located on a rear wall in housing body 101. A plurality of mounting devices 30, each of which has a plurality of conductor terminals 1 and a sensor device 40, are secured to mounting rail 60. Further electrical installation items 50 can be arranged there.

FIG. 5 also shows a readout device 200 which is configured for the wireless reading of measured values from sensor devices 40. Readout device 200 can be connected to or contain a wireless data transmission module 201, e.g., a WLAN unit. In this way, the measured values from sensor devices 40 as determined by readout device 200 can be transmitted wirelessly to a remote evaluation device. Alternatively, readout device 200 can also be connected to the evaluation device via a cable 210, e.g., via a data network.

Readout device 200 and/or wireless data transmission unit 201 can be arranged in door 102, i.e., on the inside of door 102. If door 102 is closed, readout device 200 is near the antennas of sensor devices 40.

Figure 7:
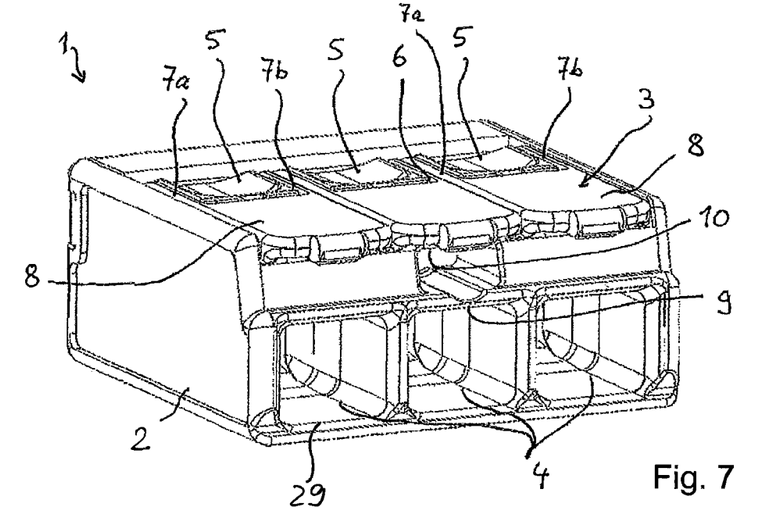
FIG. 7 shows a conductor terminal in a perspective view.
Figure 8:
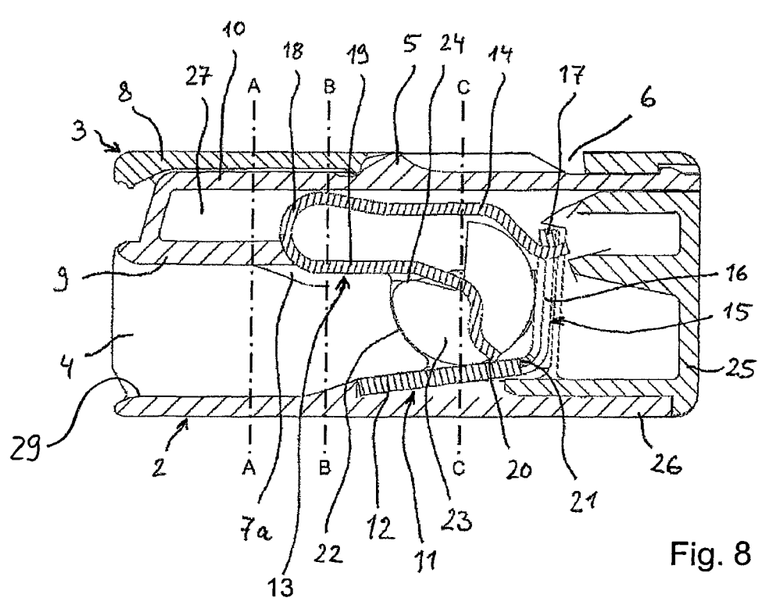
FIG. 8 shows the conductor terminal according to FIG. 7 in a side sectional view.

Conductor terminal 1 can be formed as a single conductor conductor terminal, as indicated in FIGS. 1 to 3. Conductor terminal 1 can also be formed as a multi-conductor terminal, which is formed for the connection of multiple electrical conductors. FIGS. 7 and 8 show, by way of example, an embodiment of a conductor terminal 1 which is designed for the connection of three electrical conductors and therefore has three conductor insertion openings 4.

FIG. 7 shows a perspective view of a conductor terminal 1 in the form of a lever-operated socket clamp with an insulating material housing 2 and actuating elements 3 arranged next to one another. In insulating material housing 2, conductor insertion openings 4 are provided arranged next to one another on the front side, via which the respectively associated spring-loaded terminal connections (not visible) for an electrical conductor inserted into a conductor insertion opening are accessible for clamping the same. By pivoting actuating element 3 from the shown downwards pivoted, closed state into a (not shown) upwards pivoted, open state, a clamping spring of a spring-loaded terminal connection is acted upon by actuating element 3 and a clamping point, formed by the clamping spring and a busbar of the spring-loaded terminal connection, is opened for connecting or removing a clamped electrical conductor.

It is evident further that on the top side of conductor terminal 1, housing wall sections 5, which are U-shaped in cross section, of an outer boundary wall of insulating material housing 2 each protrude into a free space 6 of an associated U-shaped actuating element 3, if actuating element 3 is pivoted downwards. In the downwards pivoted, closed state of the associated actuating element 3, these U-shaped housing wall sections 5 fill the free space 6 at least in part. The U-shaped housing wall sections 5 are preferably flush on the upper side with the top plane of insulating housing 1 formed by the upper edges of insulating housing 2.

The term "upper" or "top" is understood to mean the side of conductor terminal 1 on which actuating elements 3 are arranged in the form of pivotable actuating levers.

It is clear that actuating elements 3 have two lever arm sections 7a, 7b, spaced apart from one another, and a transverse connecting piece 8 connecting the two lever arm sections 7a, 7b to one another. This creates a pivot lever with a U-shaped cross section whose lever arm sections 7a, 7b protrude in part into insulating material housing 2 and form a pivot bearing region which is not visible. The pivot bearing region not only provides the axis of rotation for the pivot lever, i.e., for actuating element 3, but also an actuating contour, connected to a lever arm section, for acting on a clamping spring of the spring-loaded terminal connection to open a clamping point formed by the clamping spring.

A very kink-resistant pivot lever which is extremely compact and has a flat structure is created by the embodiment of actuating element 3 with two lever arm sections 7a, 7b, which are spaced apart from one another, protrude into insulating material housing 2, and are pivotably mounted there, and by transverse connecting piece 8 connecting the two lever arm sections 7a, 7b to one another. Transverse connecting piece 8 provides a wide gripping surface in order to apply an actuating force on the pivot lever to pivot actuating element 3 by hand or by an actuating tool.

It is evident further that for the middle spring-loaded terminal connection, an intermediate space, which is open on both sides as an inspection opening, is formed between a conductor insertion opening boundary wall 9 and an outer boundary wall 10 of insulating material housing 2, and the associated spring-loaded terminal connection (not visible) is accessible to an inspection tool via said space. In principle, an inspection opening from the rear side is also possible.

FIG. 8 shows a side sectional view through conductor terminal 1 from FIG. 7 in the region of an open actuating element 3. Spring-loaded terminal connection 11 is also visible, which has a busbar 12, extending transversely to conductor insertion direction L, and a clamping spring 13. Clamping spring 13 is hooked into busbar 12 with a contact arm 14.

For this purpose, busbar 12 has a retaining section 15, angled upwards in the direction of actuating element 3, with a recess 16 which enables an electrical conductor to be pushed through. Said recess 16 is delimited at the free end by a retaining connecting piece 17 against which contact arm 14 of clamping spring 13 rests. Clamping spring 13 is thus fixed on busbar 12 via retaining connecting piece 17. A spring bend 18 connects to contact arm 14, from which bend clamping arm 19 extends with a clamping edge 20 at the free end. It is clear that clamping arm 19 is bent in its end section at an angle of approximately 70° to 110°, preferably approximately 85° to 95°. The free end with clamping edge 20 is then bent back from this bent section again in the conductor insertion direction. In this way, the section bent here by approximately 90° is transverse to the conductor insertion direction, so that direct insertion of a multi-stranded or finely stranded electrical conductor without prior opening of the terminal point by pivoting actuating element 3 is prevented.

Clamping arm 19 then forms, by bending, a space for receiving the free stripped end of the inserted electrical conductor and merges into a spring bend 18 above conductor insertion opening 4. A clamping arm 19 adjoins spring bend 18, wherein the free end of clamping arm 19 has a clamping edge 20. A clamping point for clamping an electrical conductor (not shown) is formed between clamping edge 20 and busbar 12.

It is clear further that in this embodiment busbar 12 is inclined with respect to the conductor insertion direction L defined by the extension direction of conductor insertion opening 4. Busbar 12 is inclined by approximately 5° to 25° in particular relative to the upper conductor insertion opening boundary wall 9 and the front section of the opposite lower conductor insertion opening boundary wall. This provides a run-up slope for the electrical conductor and a contact edge 21 on busbar 12 in the transition to recess 16, an edge which, together with clamping edge 20 of clamping spring 13, forms a defined clamping point.

It is clear further that lever arm section 7a protrudes into the space enclosed by insulating material housing 2 and is pivotably mounted in a part-circular bearing section 22 of insulating material housing 2 with a pivot bearing region 23 of lever arm section 7a. An actuating contour 24 is provided on this pivot bearing region 23, which interacts with a laterally protruding actuating tab (not visible) of clamping arm 19 of clamping spring 13. When actuating element 3 is pivoted into the open position, the actuating tab is displaced by the rotational movement of actuating contour 24 in order to move clamping edge 20 of clamping arm 19 of clamping spring 13 away from busbar 12 and thereby to open the clamping point for an electrical conductor.

It is clear that the end-face, part-circular pivot bearing region 23 is rotatably mounted on the part-circular bearing section 22. Pivot bearing region 23 also lies on busbar 12, which also contributes to the mounting of actuating element 3.

It is evident further that insulating material housing 2 is designed in two parts. Here, a rear cover part 25 is latched to a front housing part 26 by means of latching tabs and/or latching openings. After actuating element 3 and the associated spring-loaded terminal connection 11 have been inserted into front housing part 26, the latter is closed by inserting and latching rear cover part 25.

Conductor terminal 1 is secured to a mounting device 30 by means of the front securing elements 34 and in particular latching elements 35 such that a respective latching element 35 engages behind the front region 29 of conductor insertion opening 4 shown in FIGS. 7 and 8.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A mounting device for mounting one or more conductor clamping terminals on an object, the mounting device comprising:
   one or more mounting points;
   at least one securing element being arranged at each mounting point to mechanically secure one or more conductor clamping terminals to the mounting point; and
   at least one sensor device which has at least one sensor for acquiring a physical value of at least one conductor clamping terminal secured to a mounting point,
   wherein each conductor clamping terminal includes a housing with at least one clamping spring and a busbar provided therein to clamp an electrical conductor between the at least one clamping spring and the busbar.

2. The mounting device according to claim 1, wherein the sensor device is structurally at least partially or completely integrated in a housing of the mounting device.

3. The mounting device according to claim 1, wherein the at least one sensor is arranged at a position of the mounting device in an immediate vicinity of which a busbar of a conductor clamping terminal secured to a mounting point is arranged.

4. The mounting device according to claim 1, wherein one, multiple, or all mounting points of the mounting device are set up for securing a conductor clamping terminal.

5. The mounting device according to claim 1, wherein the mounting device without the sensor device is designed as a passive component without its own electrical functionality.

6. The mounting device according to claim 1, wherein the sensor device has one or more batteries for supplying electrical energy.

7. The mounting device according to claim 1, wherein at least one securing element of a mounting point has a latching securing element via which a conductor clamping terminal is secured to the mounting point by latching.

8. The mounting device according to claim 1, wherein the sensor device has a wireless transmission unit which is set up for the wireless transmission of measured values from the at least one sensor of the sensor device to a readout device that is separate from the sensor device.

9. The mounting device according to claim 1, wherein the sensor device has a first wireless transmission unit for transmitting measured values of a current, measured by the sensor device and at least one second wireless transmission unit for wireless transmission of measured values of a voltage or potential, measured by the sensor device.

10. The mounting device according to claim 1, wherein the sensor device is set up for the wireless supplying of electrical energy required for operating the sensor device.

11. The mounting device according to claim 1, wherein the sensor device has an energy harvesting device which is set up to wirelessly receive electrical energy from the surroundings of the sensor device and to provide the electrical energy for the electrical supplying of components of the sensor device.

12. The mounting device according to claim 1, wherein the at least one sensor is a current sensor or a contactless current sensor.

13. The mounting device according to claim 1, wherein the at least one sensor is a voltage sensor or a further sensor of the sensor device is a voltage sensor.

14. The mounting device according to claim 1, wherein the sensor device is set up for acquiring at least two or at least three voltage potentials from conductor clamping terminals secured to mounting points of the mounting device.

15. The mounting device according to claim 1, wherein the sensor device is set up for acquiring the phase position of a current acquired by the sensor device with respect to a voltage potential acquired by the sensor device.

16. The mounting device according to claim 1, wherein the mounting device has a mounting rail securing element via which the mounting device is secured at least partially form-fittingly to a mounting rail of an electrical installation system.

17. The mounting device according to claim 1, wherein one or more conductor clamping terminals are secured to the respective mounting points on the mounting device.

18. A switchgear cabinet comprising:
   at least one mounting device for mounting one or more conductor clamping terminals on an object, the mounting device comprising one or more mounting points; at least one securing element being arranged at each mounting point to mechanically secure one or more conductor clamping terminals to the mounting point; and at least one sensor device which has at least one sensor for acquiring a physical value of at least one conductor clamping terminal secured to a mounting point,
   wherein each conductor clamping terminal includes a housing with at least one clamping spring and a busbar provided therein to clamp an electrical conductor between the at least one clamping spring and the busbar.

19. The switchgear cabinet according to claim 18, wherein a readout for reading acquired measured values of one or more sensor devices of the mounting device is arranged in the switchgear cabinet.

20. The switchgear cabinet according to claim 18, wherein the readout device is arranged on the inside of a door of the switchgear cabinet.

21. A readout device for reading acquired measured values of one or more sensor devices of a mounting device, the mounting device comprising one or more mounting points, at least one securing element arranged at each mounting point to mechanically secure one or more conductor clamping terminals to the mounting point and the one or more sensor devices which each have at least one sensor for acquiring a physical value of at least one conductor clamping terminal secured to a mounting point,
   wherein each conductor clamping terminal includes a housing with at least one clamping spring and a busbar provided therein to clamp an electrical conductor between the at least one clamping spring and the busbar.

22. The readout device according to claim 21, wherein the readout device has an RFID reader.

23. The readout device according to claim 21, wherein the readout device has a gateway.

24. The readout device according to claim 21, wherein the readout device is set up to determine a power measured value from current and voltage measured values that the readout device has read from one or more sensor devices of the mounting device.

* * * * *